United States Patent [19]

Sasaki et al.

[11] Patent Number: 4,826,888
[45] Date of Patent: * May 2, 1989

[54] PHOTOPOLYMERIZABLE COMPOSITION

[75] Inventors: Isao Sasaki, Hiroshima; Nobuhiro Mukai; Hitoshi Ige, both of Ohtake, all of Japan

[73] Assignee: Mitsubishi Rayon Co., Ltd., Tokyo, Japan

[*] Notice: The portion of the term of this patent subsequent to Oct. 11, 2005 has been disclaimed.

[21] Appl. No.: 847,197

[22] Filed: Apr. 2, 1986

[30] Foreign Application Priority Data

Oct. 7, 1985 [JP] Japan .................................. 60-223324

[51] Int. Cl.$^4$ .......................... C08F 2/50; C08F 20/20; C08K 5/34; C08K 5/37
[52] U.S. Cl. .......................................... 522/26; 522/13; 522/16; 522/17; 522/24; 522/27; 522/49; 522/56; 522/57; 522/103; 522/54; 522/63
[58] Field of Search ..................... 522/901, 13, 16, 24, 522/26

[56] References Cited

U.S. PATENT DOCUMENTS

| | | | |
|---|---|---|---|
| 3,639,321 | 2/1972 | Fuhr | 522/901 |
| 3,829,369 | 8/1974 | Feinberg | 522/901 |
| 4,204,928 | 5/1980 | Via | 522/901 |
| 4,275,142 | 6/1981 | Hosaka | 522/901 |
| 4,304,841 | 12/1981 | Horn et al. | 430/286 |
| 4,330,612 | 5/1982 | Tashiro | 430/287 |
| 4,349,619 | 9/1982 | Kamoshida | 430/286 |
| 4,407,927 | 10/1983 | Kamoshida | 430/286 |
| 4,777,190 | 10/1988 | Sasaki | 522/17 |

FOREIGN PATENT DOCUMENTS

| | | |
|---|---|---|
| 0028749 | 5/1981 | European Pat. Off. . |
| 155812 | 9/1985 | European Pat. Off. . |
| 150952 | 8/1986 | European Pat. Off. . |

Primary Examiner—Lewis T. Jacobs
Assistant Examiner—Arthur H. Koeckert
Attorney, Agent, or Firm—Oblon, Fisher, Spivak, McClelland & Maier

[57] ABSTRACT

A photopolymerizable composition comprising a vinyl monomer, a mercaptocarboxylic acid/α-diketone photopolymerization initiator and a storage stabilizer. The composition may admit of a filler, and exhibits excellent mechanical strength, storage stability, color and resistance to coloring, and availability.

17 Claims, No Drawings

PHOTOPOLYMERIZABLE COMPOSITION

BACKGROUND OF THE INVENTION

1. Field of the Invention

This invention concerns a novel photopolymerizable composition. More specifically, it relates to a photopolymerizable composition having excellent storage stability, with less coloration and capable of obtaining cured products having high mechanical performance.

2. Background of the Prior Art

Photopolymerization has been utilized in a wide variety of applications such as for image formation in fine fabrication processes, for example, for print materials, photosensitive agents for reproduction, printed wirings, IC and shadow masks; as well as for paints, printing inks, adhesives and the likes.

Polymerization has also been utilized in the dental art, for example, photopolymerizable compositions have been used for the production of tooth filler (composite resin, etc), tooth sealing material and dental adhesives, as well as for the production of carious tooth preventive fillers, tooth crowns and denture.

As the photopolymerizable compositions having been utilized heretofore as described above, Japanese Patent Publication No. 10986/1979, for instance, describes a photopolymerizable composition capable of curing under the irradiation of visible light or ultraviolet light and having a specific composition. The photopolymerizable composition comprises a photoinitiator complex of photosensitive agent/reducing agent, that is, a photosensitive catalyst composed of (a) at least one photosensitive agent represented by the following general formula:

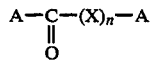

where X represents C=O, $CR_1'R_2'$ or $CR_3'OR_4'$, $R_1'-R_4'$ which may be identical or different with each other represent individually hydrogen or a hydrocarbon group, n is 0 or 1, the groups A which may be identical or different with each other represent individually substituted or non-substituted hydrocarbon groups, in which both of the groups A may be coupled directly or joined together by way of a bivalent hydrocarbon group, or both of the groups A may form together a condensated aromatic ring, and the group A is substituted or nonsubstituted aromatic group when n is 1 and X represents $CR_1'R_2'$ or when n is 0, (b) at least one reducing agent represented by the following general formula:

where the units R which may be identical or different with each other represent individually hydrogen, substituted or non-substituted hydrocarbon groups or two units R may form a ring together with N, provided that three units R are not simultaneously substituted hydrocarbon groups, and N is not directly coupled to the aromatic group, and (c) a polymerizable ethylenic unsaturated material. Specific examples of particularly preferred photosensitive agents can include biacetyl, benzil, benzophenone, camphor quinone, etc. As the reducing agent, there are described trimethyl amine, tripropylamine, dimethylamine, propylamine, N,N'-dimethylaniline, N-methyldiphenylamine, ethylenediamine, hexamethylenediamine, dimethylaminoethyl methacrylate, piperidine and the like. Although the materials using these photoinitiators can provide rapid curing under photoirradiation, there have been serious practical problems in that curing products suffer from remarkable coloration (mostly yellowing), significant aging change of the color under sunlight and in water, and inhibit inferior strength. Further, the composition has an extremely low storage stability under heat and circumstantial light (natural light) and resulting spontaneous curing.

SUMMARY OF THE INVENTION

The object of this invention is to overcome the foregoing problems in the prior art and provide a photopolymerizable composition having excellent storage stability under heat and circumstantial light, with no coloration and aging change for the tone and providing products with excellent mechanical performances.

DETAILED DESCRIPTION OF THE PREFERRED EMBODIMENTS

The photopolymerizable composition according to this invention comprises:
(1) a vinyl monomer,
(2) a photopolymerization initiator comprising a combination of mercaptocarboxylic acid and α-diketone, and,
(3) a storage stabilizer.

The vinyl monomer of this invention may be a mono-functional vinyl compound or poly-functional vinyl compound. The mono-functional vinyl compound can include, for example, styrene, acrylonitrile, vinyl acetate, methyl acrylate and methyl methacrylate, ethyl acrylate and ethyl methacrylate, butyl acrylate and butyl methacrylate, hydroxyethyl acrylate and hydroxyethyl methacrylate, methoxyethyl acrylate and methoxyethyl methacrylate, glycidyl acrylate and glycidyl methacrylate, methacryloxyethyl trimellitic acid and acid anhydride thereof. Further, the poly-functional vinylic compound can include, for example, ethylene glycol di-acrylate and ethylene glycol di-methacrylate, diethylene glycol di-acrylate and diethylene glycol di-methacrylate, triethylene glycol di-acrylate and triethylene glycol di-methacrylate, polyethylene glycol di-acrylate and polyetylene glycol di-methacrylate, 1,4-butane-diol diacrylate and 1,4-butane-diol di-methacrylate, 1,3-butanediol di-acrylate and 1,3-butane-diol di-methacrylate, 1,6-hexane-diol diacrylate and 1,6-butane-diol di-methacrylate, glycerin diacrylate and glycerin di-methacrylate of the following general formula:

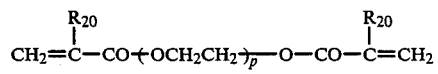

where $R_{20}$ represents hydrogen atom or methyl group and p is an integer from 1 to 20, as well as bisphenol A diglycidyl acrylates and bisphenol A diglycidyl methacrylates, urethane di-acrylates and urethane di-methacrylates, trimethylol propane tri-acrylate and trimethylol propane tri-methacrylate, pentaerythritol tetra-acrylate and pentaerythritol tetra-methacrylate, bisphenol A di-acrylate and bisphenol A di-methacrylate represented by the following general formula:

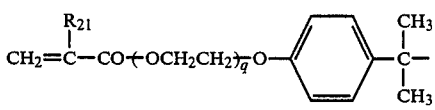

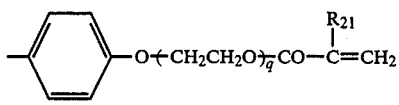

where $R_{21}$ represents hydrogen atom or methyl group and q is an integer from 1 to 20. These acrylates and methacrylates may be used alone or in combination of two or more of them.

The mercaptocarboxylic acid used as the photopolymerization initiator in this invention is preferably a compound represented by the following general formula:

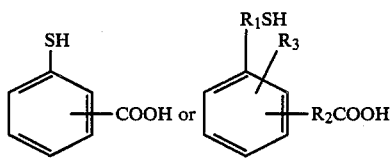

where $R_1$ and $R_2$ represent individually an alkylene group from 1 to 5 carbon atoms or phenylene group, $R_3$ represents nitro group, hydroxy group, amino group or halogen atom. Specifically, they include o-, m- and p-mercaptobenzoic acid, o-, m- and p-mercaptophenyl acetic acid, o-, m- and p-mercaptophenyl propionic acid, o-, m-, and p-mercaptophenyl butyric acid, mercaptobiphenyl carboxylic acid, o-, m- and p-mercaptomethyl benzoic acid, o-nitro-p-mercapto benzoic acid, o-hydroxy-p-mercapto benzoic acid, o-amino-p-mercapto benzoic acid and o-chloro-p-mercapto-benzoic acid. Particularly, preferred mercaptocarboxylic acids are o-mercaptobenzoic acid (thiosalycilic acid), m-mercaptobenzoic acid and p-mercaptobenzoic acid.

All sort of α-diketones can be used with no particular restriction and preferred are camphor quinone, benzil, acetyl benzoyl, acenaphthene quinone, α-napthil, dichlorobenzil, biacetyl, β-naphthil, benzoin, α-naphthoin and β-naphthoin. Among them camphor quinone is most prefered.

The photopolymerization initiator is added to the above-mentioned vinyl monomer by an amount from $10^{-5}\%$ by weight to 30% by weight, preferably, from $10^{-3}$ by weight to 15% by weight and, particularly preferably, from $10^{-1}\%$ by weight to 5% by weight based on the monomer. The amount of the α-diketone blended to the mercaptocarboxylic acid is from $10^{-5}\%$ by weight to $10^{-2}\%$ by weight, preferably, from $10^{-3}\%$ by weight to 50% by weight and, particularly preferably, from $10^{-1}\%$ by weight to 20% by weight based on the mercaptocarboxylic acid. These blending amounts are suitable in that the photopolymerization curing product is free from coloration and aging change in the color and further a composition of a high mechanical strength can be obtained.

The storage stabilizer used in this invention is added to significantly reduce the curing of the composition comprising the vinyl monomer and the photopolymerization initiator, under heating and circumstantial light.

The storage stabilizer used in this invention can include the following.

(A) A triazine series compound represented by the general formula:

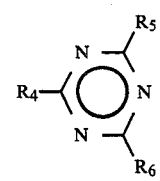

where $R_4$, $R_5$ and $R_6$ represent individually hydrogen atom, halogen atom, alkyl group, hydroxy group, alkoxy group, phenoxy group, alkyl peroxy group, amino group represented by $NR_7R_8$ in which $R_7$ and $R_8$ represent individually hydrogen atom, alkyl group or aromatic group and derivatives thereof, or a thio group represented by $SR_9$ in which $R_9$ represents hydrogen atom or alkyl group, for example, 2,4-bis-(n-octylthio)-6-(4-hydroxy-3,5-di-tert-butylanilino)-1,3,5-triazine, 2-(N,N-dibutylamino)-4,6-dimercapto-1,3,5-triazine and 2-anilino-4,6-dimercapto-1,3,5-triazine.

(B) A benzotriazole series compound represented by the general formula:

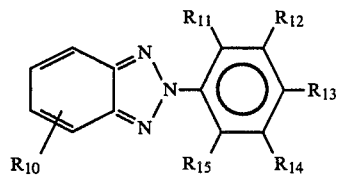

where $R_{10}$ represents hydrogen atom or halogen atom, $R_{11}$, $R_{12}$, $R_{13}$, $R_{14}$ and $R_{15}$ represent individually hydrogen atom, hydroxy group, alkyl group from 1 to 10 carbon atoms, or benzyl group and derivatives thereof, for example, 2-(5-methyl-2-hydroxyphenyl)benzotriazole, 2-(2-hydroxy-3,5-bis(α,α-dimethylbenzyl)-phenyl)benzotriazole, 2-(3,5-di-tert-butyl-2-hydroxyphenyl)benzotriazole, 2-(3-tert-butyl-5-methyl-2-hydroxyphenyl)-5chlorobenzotriazole, 2-(3,5-di-tert-butyl-2-hydroxyphenyl-5-chlorobenzotriazole, 2-(3,5-di-tert-amyl-2-hydroxyphenyl) benzotriazole.

(C) Oxalic acid anilide series compounds, for example, 2-ethoxy-2'-ethyloxalic acid anilide, 2-example, ethoxy-5-tert-butyl-2'-ethyloxalic acid bisanilide.

(D) Hindered amine series compounds, for example, polycondensate of dimethyl-1-(2-hydroxyethyl)-4-hydroxy-2,2,6,6-tetramethylpideridine succinate, (poly((6-(1,1,3,3-tetramethylbutyl)imino-1,3,5-triazine-2,4-di-yl) ((2,2,6,6-tetramethyl-4-piperidyl) imino)hexamethylene ((2,2,6,6-tetramethyl-4-piperidyl) imino)), 2-(3,5-di-tert-butyl-4-hydroxybenzyl)-2-nbutyl malonic acid bis(1,2,2,6,6-pentamethyl-4-piperidyl).

(E) Thiuram Sulfide series compounds represented by the general formula:

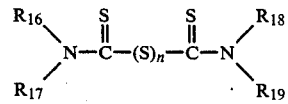

where $R_{16}$, $R_{17}$, $R_{18}$ and $R_{19}$ represent individually hydrogen atom or alkyl group from 1 to 10 carbon atoms and n is an integer from 1 to 4, for example, tetraethylthiuram disulfide, tetramethylthiuram disulfide, tetrakis(2-ethylhexyl)thiuram disulfide. Among these compounds, particularly preferred in view of the color, storage stability and mechanical properties of the cured product, are 2,4-bis-(n-octylthio)-6-(4-hydroxy-3,5-di-tert-butylanilino)-1,3,5-triazine, 2-(5-methyl-2-hydroxyphenyl)benzotriazole and tetraethylthiuram disulfide.

The above-mentioned storage stabilizer can be used singly or as a combination of two or more, and the amount of use relative to the above-mentioned vinyl monomer is from $10^{-3}\%$ by weight to 10% by weight, preferably, from $10^{-2}\%$ by weight to 5% by weight and, particularly preferably, from $5\times10^{-2}\%$ by weight to 1.0% by weight.

In the composition according to this invention, a filler may further be added to the above-mentioned ingredients as required. The filler ingredient can include metals belonging to the groups I, II, III, IV and V and transition metals of the periodical table, oxides, hydroxides, chlorides, sulfates, sulfite, carbonates, phosphates, silicates, as well as mixtures and complex salts thereof. Among them, particularly preferred are silicon dioxide, quartz powder, aluminum oxide, barium sulfate, titanium oxide, talc, glass powder, glass bead, glass fillers containing barium salt and lead salt, silica gel, colloidal silica, carbon fibers, zirconium oxides, tin oxides and other ceramics powders. The above-mentioned fillers may be non-treated fillers, surface treated fillers with silane coupling agent or the like, or organic compound fillers compounded with a polymer and then pulverized.

The blending amount of the filler may properly be varied depending on the purpose of use for the photopolymerized curing product. For instance, in a case where the filler is used as the filler for dental material, it is blended to the above-mentioned vinyl monomer within a range from 1 to $10^3\%$ by weight, preferably, from 10 to $9.5\times10^2\%$ by weight and, particularly, preferably from 20 to $9.0\times10^2\%$ by weight into a paste-like composition.

Further, colorants, pigments (for example, iron oxide and titanium oxide, etc) or dyes may be blended as required in the composition according to this invention.

not be obtained in the prior method and, further, the composition according to this invention exhibits an extremely high storage stability.

This invention will now be described more specifically referring to examples but the invention is no way limited to these examples.

EXAMPLES 1-3, COMPARATIVE EXAMPLE 1

| | |
|---|---|
| 2,2-bis(4-(3-methacryloxy-2-hydroxypropoxy) phenyl)propane (hereinafter simply referred to as Bis—GMA) | 4 g |
| Triethylene glycol dimethacrylate (hereinafter simply referred to as 3G) | 6 g |
| Photopolymerization initiator | |
| (thiosalicylic acid | 3.0% by weight |
| camphor quinone | 0.05% by weight |
| each based on the monomer) | |
| Storage stabilizer (the compounds as described in Table 1 in the addition amount also described therein) | | was poured into a teflon tube (4 mm inner diameter and 20 mm height) sealed at the lower surface till the upper liquid surface reached the upper surface of the teflon tube. Then, a visible light irradiator manufactured by 3M Corporation (tradename' OPTILUX) was arranged such that the distance between the light irradiation surface and the liquid surface was 1 mm and visible rays were irradiated for 30 seconds. Then, the poured monomer mixture was taken out from the teflon tube, removed with the not-polymerized portion and measured for the "thickness" of the resulted polymerized curing product.

Further, the monomer mixture of the same composition as described above was also prepared separately and poured into two vessels made of polypropylene (30 cc volume) each by 5 g. One of the samples was placed in a dark room at 60° C. after tightly closing the cover and the other of the samples was place under circumstantial light at ambient temperature without closing the cover to measure the storage stability till they cured spontaneously.

Table 1 shows the kind and the amount of the storage stabilizer, and the results of the measurement or the aforementioned "thickness" and storage stability.

TABLE 1

| | Kind of storage stabilizer | Addition amount (% based) on monomer | Measured thickness (mm) | Storage stability | |
|---|---|---|---|---|---|
| | | | | days of curing 60° C. in the dark room | curing time at ambient temp. under circumstantial light |
| Example 1 | 2,4-bis-(n-octylthio)-6-(4-hydroxy-3,5-di-tert-butylanilino)-1,3,5-triazine | 0.1 | greater than 20 | more than 14 days | 10 hrs |
| Example 2 | 2-(5-methyl-2-hydroxyphenyl)benzotriazole | 0.1 | greater than 20 | more than 14 days | 10 hrs |
| Example 3 | Tetraethylthiuram disulfide | 0.1 | greater than 20 | more than 14 days | 10 hrs |
| Comparative Example 1 | — | — | greater than 20 | one day | 1 hr |

Since a photopolymerization initiator capable of curing within the range of visible rays is used in the photopolymerizable composition according to this invention, all of the problems in the prior art for UV-photopolymerization, that is, deleterious effect to human bodies, poor curing performance (depth) and expensive installation cost can be avoided and, further, the cured product obtained through the photocuring has excellent color stability, and high mechanical performances that could As apparent from Table 1, it can be seen that the composition according to this invention exhibits good photocuring performance even if the storage stabilizer is added and is excellent in the storage stability. Further, the photocuring polymerizate according to this invention was substantially free from coloration and much fine in the appearance.

EXAMPLES 4-6, COMPARATIVE EXAMPLE 2

A monomer-filler mixture (paste) comprising the composition:

| | |
|---|---|
| Bis—GMA | 0.8 g |
| 3G | 1.2 g |
| Silane-modified quartz powder | 8 g |
| Photopolymerization initiator | |
| (thiosalicyclic acid | 3.0% by weight |
| camphor quinone | 0.05% by weight |
| each based on the monomer) | |
| Storage stabilizer | |
| (the compound as described in Table 2 in the addition amount also described therein) | | was prepared and the "thickness" and the storage stability of the polymerized curing product were measured by using the same measuring procedures as carried out in Example 1.

Table 2 shows the kinds and the amount of the storage stability, "thickness" and the measurement for the result of the storage stability.

EXAMPLES 7-15, COMPARATIVE EXAMPLES 3-4

A monomer-filler mixture (paste) comprising:

| | |
|---|---|
| Bis-GMA | 0.8 g |
| 3G | 1.2 g |
| Silane-modified quartz powder | 7.4 g |
| Fine silicon dioxide powder | 0.6 g |

Photopolymerization initiator of Examples 1 and 2 was treated in the same manner as in Example 4 and irradiated under the visible rays for 60 seconds. Then, the resulting photopolymerized cured product was cut to prepare a 4×6 mm cylindrical test specimen and measured for compression strength, change in color after exposure to sunlight for one week and change in the color after immersion in water at 60° C. for one week.

Table 3 shows the kind and the amount of the storage stabilizer and the results of the measurement as described above.

TABLE 3

| | Kind of storage stabilizer | Compression strength (kg/cm$^2$) | Change in the color after one week exposure for sunlight | Change in the color after one week immersion in water at 60° C. |
|---|---|---|---|---|
| Example 7 | 2,4-bis(n-octyl-thio)-6-(4-hydroxy-3,5-di-tert-butylanilino)-1,3,5-triazine | 2950 | none | none |
| Example 8 | 2-(N,N—dibutylamino)-4,6-dimercapto-1,3,5-triazine | 2940 | none | none |
| Example 9 | 2-anilino-4,6-dimercapto-1,3,5-triazine | 2940 | none | none |
| Example 10 | 2-(5-methyl-2-hydroxyphenyl)benzotriazole | 2960 | none | none |
| Example 11 | 2-ethoxy-2'-ethyloxalic acid bisanilide | 2940 | none | none |
| Example 12 | 2-(3,5-di-tert-butyl-4-hydroxybenzyl)-2-n-butyl malonic acid bis(1,2,2,6,6-pentamethyl-4-piperidyl) | 2950 | none | none |
| Example 13 | Tetraethylthiuram disulfide | 2950 | none | none |
| Example 14 | Tetramethylthiuram disulfide | 2940 | none | none |
| Example 15 | Tetrakis(2-ethylhexyl)thiram disulfide | 2940 | none | none |
| Comparative Example 3 | — | 2950 | none | none |
| Comparative Example 4 | Hydroquinone | 2100 | none | none |

TABLE 2

| | Kind of storage stabilizer | Addition amount (%, based) on monomer | Measured thickness (mm) | Storage stability days of curing 60° C. in the dark room | Storage stability curing time at ambient temp. under circumstantial light |
|---|---|---|---|---|---|
| Example 4 | 2,4-bis-(n-octylthio)-6-(4-hydroxy-3,5-di-tert-butylanilino)-1,3,5-triazine | 0.1 | 12.2 | more than 14 days | 10 hrs |
| Example 5 | 2-(5-methyl-2-hydroxy-phenyl)benzotriazole | 0.1 | 12.2 | more than 14 days | 10 hrs |
| Example 6 | Tetraethylthiuram di-sulfide | 0.1 | 12.1 | more than 14 days | 10 hrs |
| Comparative Example 2 | — | — | 12.0 | one day | one hr |

As apparent from Table 2, it can be seen that the composition according to this invention exhibits excellent photocuring performance even if the filler is added and is excellent in storage stability. Further, the photocuring polymerizate according to this invention was substantially free from coloration and extremely fine and uniform in appearance.

As apparent from Table 3, the composition according to this invention has excellent mechanical properties and simultaneously excellent storage stability and high color stability.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A photopolymerizable composition comprising:
   (1) as the sole polymerizable compound or compounds therein at least one vinylic monomer selected from at least one monoethylenically vinylic monomer, wherein the said vinylic monomer is selected from styrene, acrylonitrile, ninyl acetate, methyl acrylate, methyl methacrylate, ehtyl acrylate, ethyl methacrylate, butyl acrylate, buty methacrylate, hydroxyethyl acrylate, hydroxyethyl methacrylate, methoxyethyl acrylate, methoxyethyl methacrylate, glycidyl acrylate or glycidyl methacrylate, and at least one polyethylenically vinylic monomer wherein the said polyethylenically vinylic monomer is selected from a compound represented by the following formula:

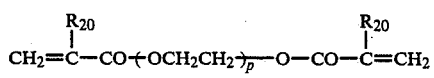

wherein:

$R_{20}$ is a hydrogen atom or a methyl group; and p is an integer of from 1 to 20, a compound represented by the following formula:

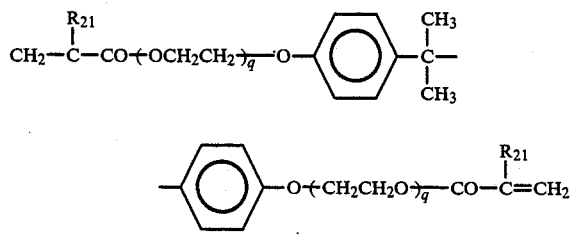

wherein;

$R_{21}$ is a hydrogen atom or a methyl group; and q is an integer of from 1 to 20, bisphenol A diglycidyl acrylate, bisphenol A diglycidyl methacrylate, trimethylolpropane triacrylate, trimethylolpropane trimethyacrylate, pentaerythritol tetraacrylate or pentaerythritol tetramethacrylate, 1,4-butanediol diacrylate, 1,4-butanediol dimethacrylate, 1,3-butanediol diacrylate, 1,3-butanediol dimethacrylate, 1,6-hexanediol diacrylate, 1,6-hexanediol dimethacrylate, glycerine diacrylate and glycerine dimethyacrylate, (2) a photopolymerization initiator comprising a combination of a mercaptocarboxylic acid and a α-diketone, and
   (3) a storage stabilizer comprising a triazine series compound.

2. The photopolymerizable composition as defined in claim 1, wherein the mercaptocarboxylic acid is a compound represented by the general formulas (I) or (II):

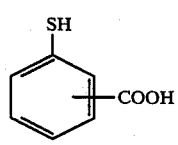

or

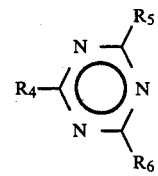

wherein $R_1$ and $R_2$ represent individually an alkylene group from 1 to 5 carbon atoms or a phenylene group and $R_3$ represents a nitro group, a hydroxy group, an amino group or halogen atom.

3. The photopolymerizable composition of claim 1, wherein the α-diketone is camphor quinone.

4. The photopolymerizable composition of claim 1, wherein the mercaptocarboxylic acid is selected from the group consisting of ortho-mercaptobenzoic acid (thiosalicyclic acid), meta-mercaptobenzoic acid, para-mercaptobenzoic acid, ortho-mercaptophenyl acetic acid, meta-mercaptophenyl acetic acid, para-mercaptophenyl acetic acid, ortho-mercaptophenyl propionic acid, meta-mercaptophenyl propionic acid, para-mercaptophenyl propionic acid, ortho-mercaptophenyl butyric acid, meta-mercaptophenyl butyric acid, para-mercaptophenyl butyric acid, mercaptobiphenyl carboxylic acid, ortho-mercaptomethyl benzoic acid, meta-mercaptomethyl benzoic acid, para-mercaptomethyl benzoic acid, ortho-nitro-paramercaptobenzoic acid, ortho-hydroxy-paramercaptobenzoic acid, ortho-amino-para-mercaptobenzoic acid, ortho-chloro-para-mercaptobenzoic acid and mixtures thereof.

5. The photopolymerizable composition of claim 1, wherein the triazine series compound is a compound represented by the general formula:

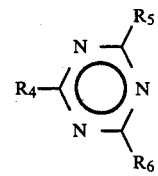

where $R_4$, $R_5$ and $R_6$ represent individually a hydrogen atom, halogen atom, alkyl group, hydroxy group, alkoxy group, phenoxy group, alkyl peroxy group, amino group represented by $NR_7R_8$ in which $R_7$ and $R_8$ represent individually hydrogen atom, alkyl group or aromatic group and derivatives thereof, or a thio group represented by $SR_9$ in which $R_9$ represents hydrogen atom or alkyl group.

6. The photopolymerizable composition of claim 5, wherein the triazine series compound is selected from the group consisting of 2,4-bis-(n-octylthio)-6-(4-hydroxy-3,5-di-tert-butylanilino)-1,3,5-triazine, 2-(N,N-dibutylamino)-4,6-dimercapto-1,3,5-triazine, 2-anilino-4,6-dimercapto-1,3,5-triazine and mixtures thereof.

7. The photopolymerizable composition of claim 1, wherein the said polyethylenically vinylic monomer represented by the following formula:

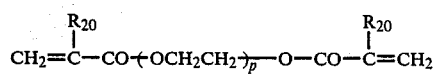

where;

$R_{20}$ is a hydrogen atom or a methyl group; and p is an integer of from 1 to 20, is ethylene glycol diacrylate, ethylene glycol dimethacrylate, diethylene glycol diacrylate, diethylene glycol dimethacrylate, triethylene glycol diacrylate, triethylene glycol dimethacrylate, polyethylene glycol diacrylate or polyethylene glycol dimethacrylate.

8. The photopolymerizable composition of claim 1, wherein the said polyethylenically vinylic monomer is a compound represented by the following formula:

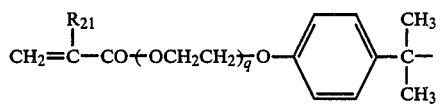

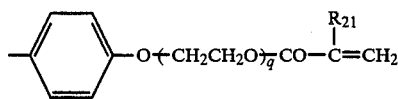

wherein;

$R_{21}$ is a hydrogen atom or a methyl group; and q is an integer of from 1 to 20.

9. The photopolymerizable composition of claim 1, wherein the said monomer is bisphenol A diglycidyl acrylate or bisphenol A diglycidyl methacrylate.

10. The photopolymerizable composition of claim 1, which further comprises a filler.

11. The photopolymerizable composition of claim 10, wherein the said filler comprises an oxide, a hydroxide, a chloride, a sulfate, a sulfite, a carbonate, a phosphate, or a silicate of a metal of groups I, II, III, IV and V of the Periodic Table and transition metals.

12. The photopolymerizable composition of claim 10, wherein the said filler comprises silicon dioxide, quartz powder, aluminum oxide, barium sulfate, titanium oxide, talc, glass powder, glass beads, glass fibers, glass fillers containing barium salt and lead salt, silica gel, colloidal silica, carbon fibers, zirconium oxide or tin oxide.

13. The photopolymerizable composition of claim 1, wherein the said storage stabilizer is added in an amount of from $10^{-3}$% by weight to 10% by weight based on the monomer.

14. The photopolymerizable composition of claim 1, wherein the said storage stabilizer is added in an amount of from $10^{-2}$% by weight to 5% by weight based on the monomer.

15. The photopolymerizable composition of claim 1, wherein the said mixture of photoinitiators are added in an amount of from $10^{-5}$% by weight to 30% by weight based on the vinylic monomer.

16. The photopolymerizable composition of claim 1, wherein the said mixture of photoinitiators are added in an amount of from $10^{-3}$% by weight to 15% by weight based on the vinylic monomer.

17. The photopolymerizable composition of claim 1, wherein the said mixture of photoinitiators are added in an amount of from $10^{-1}$% by weight to 5% by weight based on the vinylic monomer.

* * * * *